(12) United States Patent
Pan

(10) Patent No.: US 8,973,199 B2
(45) Date of Patent: Mar. 10, 2015

(54) PHOTOMASK CLEANING DEVICE

(71) Applicant: Gudeng Precision Industrial Co, Ltd., New Taipei (TW)

(72) Inventor: Yung-Chin Pan, New Taipei (TW)

(73) Assignee: Gudeng Precision Industrial Co., Ltd., New Taipei (TW)

( * ) Notice: Subject to any disclaimer, the term of this patent is extended or adjusted under 35 U.S.C. 154(b) by 210 days.

(21) Appl. No.: 13/761,236

(22) Filed: Feb. 7, 2013

(65) Prior Publication Data

US 2014/0137347 A1  May 22, 2014

(30) Foreign Application Priority Data

Nov. 19, 2012 (TW) .............................. 101222391 U

(51) Int. Cl.
G03F 1/82 (2012.01)
B08B 1/00 (2006.01)
B08B 3/02 (2006.01)

(52) U.S. Cl.
CPC .................................... *G03F 1/82* (2013.01)
USPC ....................... 15/102; 15/97.1; 15/77; 134/6

(58) Field of Classification Search
CPC ............................... G03F 7/70925; G03F 1/82
USPC ............... 15/97.1, 77, 102, 103.5; 134/6, 50, 134/94.1, 201, 902; 401/9, 10
See application file for complete search history.

(56) References Cited

U.S. PATENT DOCUMENTS

| 5,651,160 | A | * | 7/1997 | Yonemizu et al. | ............... | 15/302 |
| 6,247,197 | B1 | * | 6/2001 | Vail et al. | ............ | 15/77 |
| 6,381,796 | B1 | * | 5/2002 | Sato | .................. | 15/77 |
| 6,983,755 | B2 | * | 1/2006 | Nam et al. | .................... | 134/147 |
| 7,531,044 | B2 | * | 5/2009 | Dickerson et al. | ............... | 134/15 |
| 2004/0064906 | A1 | * | 4/2004 | Behar | ............................ | 15/21.1 |

* cited by examiner

*Primary Examiner* — Mark Spisich
*Assistant Examiner* — Andrew A Horton
(74) *Attorney, Agent, or Firm* — Li & Cai Intellectual Property (USA) Office

(57) ABSTRACT

A photomask cleaning device includes a stage, a fluid dispenser, a scrubbing unit, a cover and a fixing unit. The fluid dispenser includes a direct dispensing unit disposed correspondingly to the scrubbing unit, and an oblique dispensing unit obliquely spraying water onto a photomask. Majority of the particles can be removed with the combined application of the oblique dispensing unit and the scrubbing unit.

15 Claims, 5 Drawing Sheets

1

PHOTOMASK CLEANING DEVICE

BACKGROUND OF THE INVENTION

1. Field of the Invention

The instant disclosure relates to a photomask cleaning device; in particular, to a cleaning device having integrated scrubbing unit and obliquely arranged cleanser dispenser for removing particles on photomasks.

2. Description of Related Art

As electronic products are increasingly slimmer and lighter, wafer fabrication, which lays the foundation for miniature modern electronic components, becomes ever-increasingly essential to product competiveness. In the fabrication of wafers, photomasks are applied for transferring desirable patterns onto wafers through etching process. When photomasks retain undesired particles thereon, undesired patterns are likely to form on the wafers, thus particle-free photomasks are desired. As a result, cleanliness of the photomasks is essential to the fabrication of wafers.

If only liquid cleansers are used for photomask cleaning, particle residuals are likely to retain on the photomasks to cause contamination. In addition, with the application of traditional wash nozzles and brushes, effluents from cleaned portions of the photomasks may backwash onto other cleaned portions of photomasks which may allow undesired particles to reform on the photomasks while the brushes are likely to scratch the surface of the photomasks.

To address the above issues, the inventor strives via associated experience and research to present the instant disclosure, which can effectively improve the limitation described above.

SUMMARY OF THE INVENTION

The instant disclosure provides a photomask cleaning device for removing particles therefrom through a saturated scrubbing unit which loosens particles along with obliquely dispensed fluid flow to remove loosen particles from photomasks. Moreover, a fixing arm and a fixing unit facilitate replacement of the scrubbing unit and draining. Specifically, the photomask cleaning device configured towards photomasks includes a stage, a fluid dispenser disposed on the stage, a scrubbing unit, a cover which secures the scrubbing unit onto the fluid dispenser, and a fixing unit. The fluid dispenser includes an oblique dispensing unit, and a direct dispensing unit on which the scrubbing unit envelopes to moist the scrubbing unit and reduce the chances of damaging the photomask. The oblique dispensing unit provides fluids towards the general contacting region between the scrubbing unit and photomask in a slanted fashion, thereby removing particles from the photomask through fluid flow dispensed from the dispenser.

Through the instant embodiment, the cover is disposed on the direct dispensing unit configured to allow exposure of the direct dispensing unit. The cover includes an oblique surface disposed thereon and slanted away from the stage for effluents after cleaning to smoothly flow away from the fluid dispenser.

One objective of the instant disclosure is to rinse and remove undesired particles on the photomask 9 through the combined configuration of the oblique dispensing unit 11 and the scrubbing unit 20. In addition, with the oblique surface, effluents from after cleaning prevent flooding around the fluid dispenser, thus eliminating effluents to backwash into the fluid dispenser for subsequent cleaning.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

Figure 1:
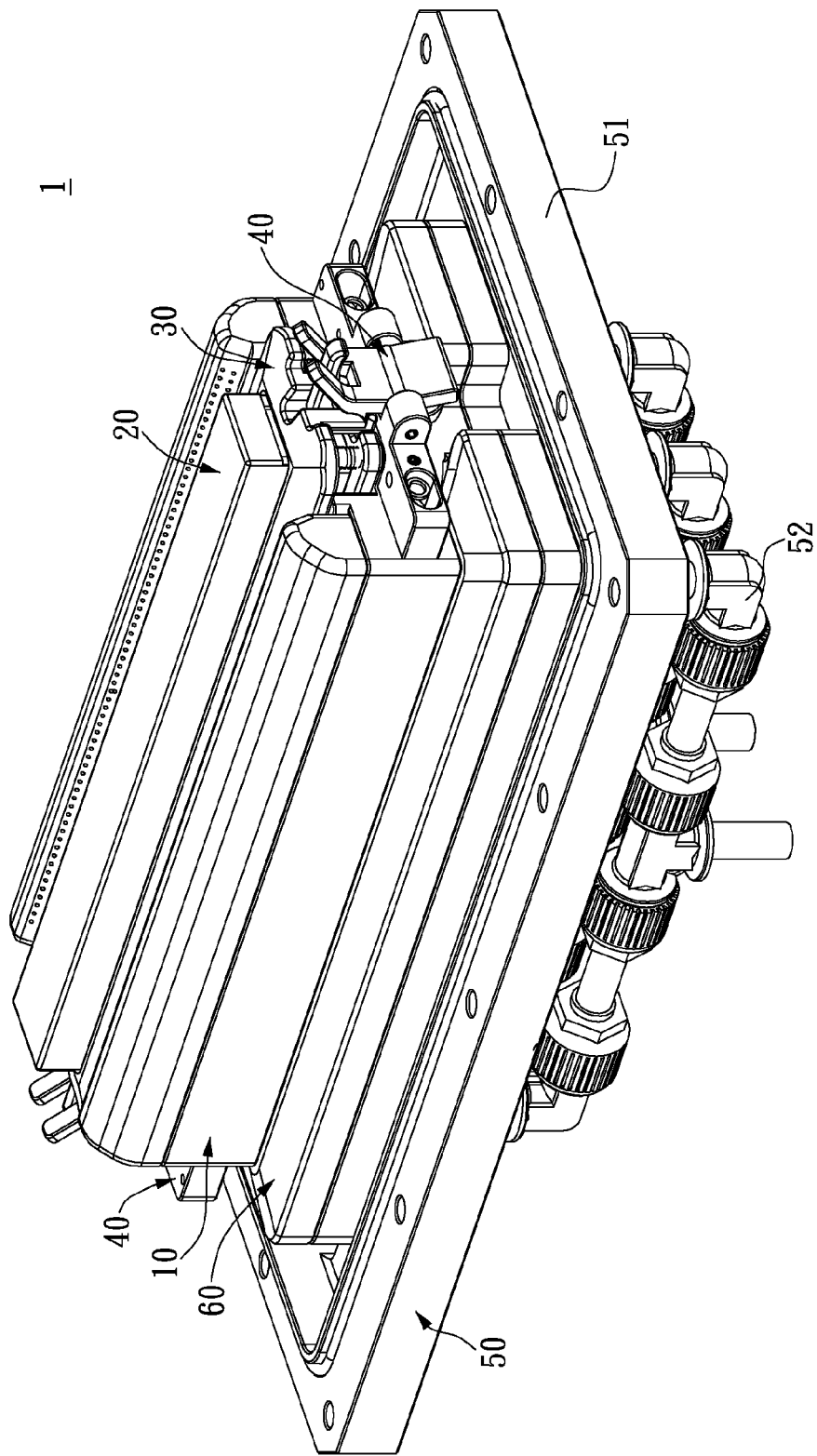
FIG. 1 is a perspective view for the photomask cleaning device according to the embodiments of the instant disclosure.
Figure 3:
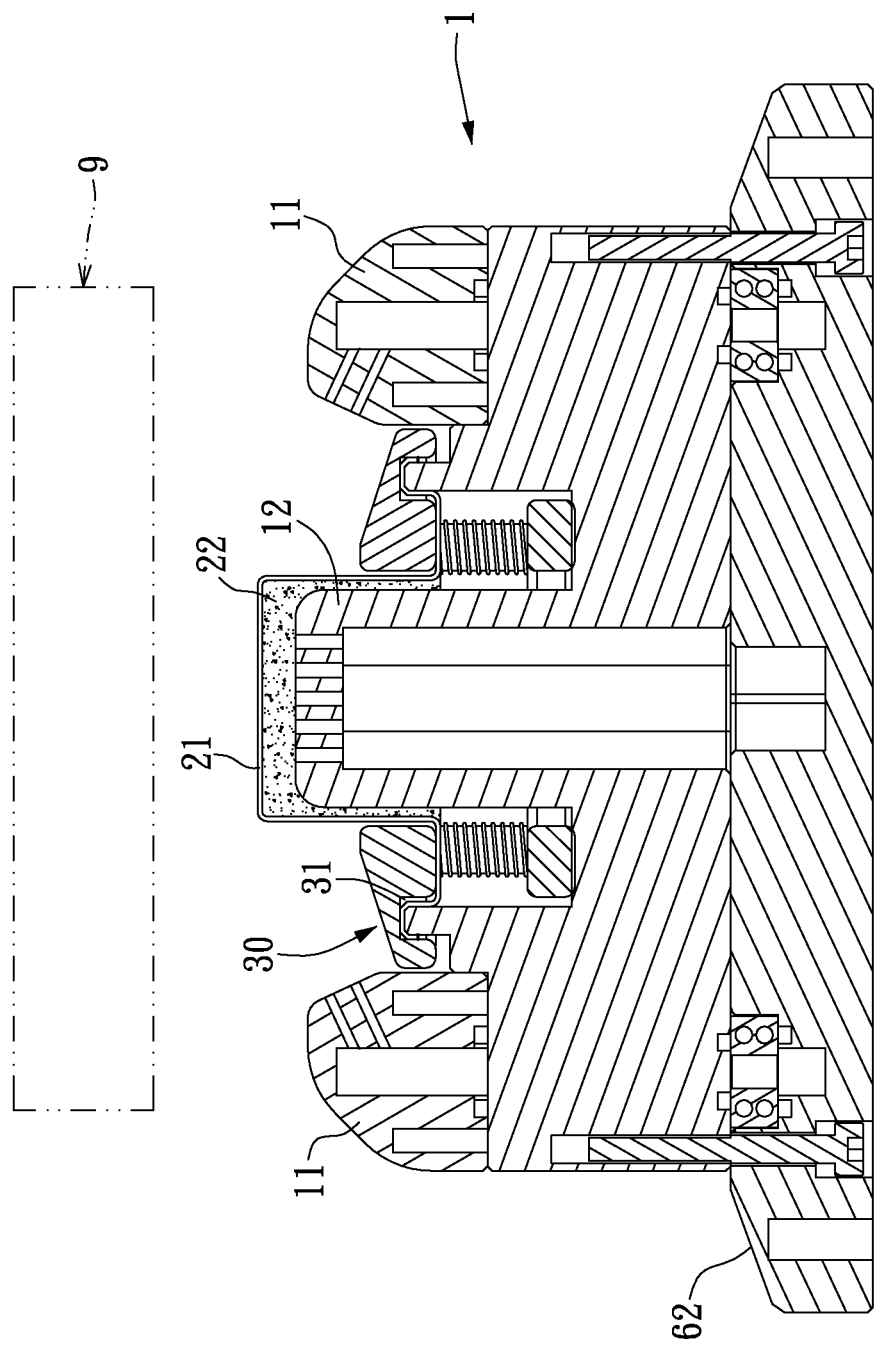
FIG. 3 is a cross-sectional view for the photomask cleaning device according to the embodiments of the instant disclosure.

Referring to FIG. 1, a photomask cleaning device 1 includes a stage 50, a fluid dispenser 10 disposed above the stage 50, a guiding base 60 disposed between the dispensing unit 10 and the stand 50, a scrubbing unit 20 disposed above the dispensing unit 10, a cover 30 securing the scrubbing unit 20 to the dispensing unit 10, and a fixing unit 40 securing the cover 30 to the dispensing unit 10. When cleaning a photomask 9, the photomask 9 is generally secured above the cleaning device 1 as shown in FIGS. 1 and 3. The cleaning device 1 is generally in parallel with the geometric plane of the photomask 9 desired to be cleaned. Particles on the photomask 9 are then loosened by the scrubbing unit 20 and removed by the flow of a cleaning fluid such as water. The cleaning fluid is not limited to the examples of the embodiment provided herein and may also be cleaning solution suitable for cleaning photomasks.

Referring to FIG. 1, the stage 50 includes a retaining plate 51 and a plurality of fluid supplying conduits 52 attached to a side of the retaining plate 51. The retaining plate 51 includes a pit 511 arranged on a surface thereof and a slit 512 arranged on a side thereof for draining water without affecting the operation of the device 1.

Figure 2:
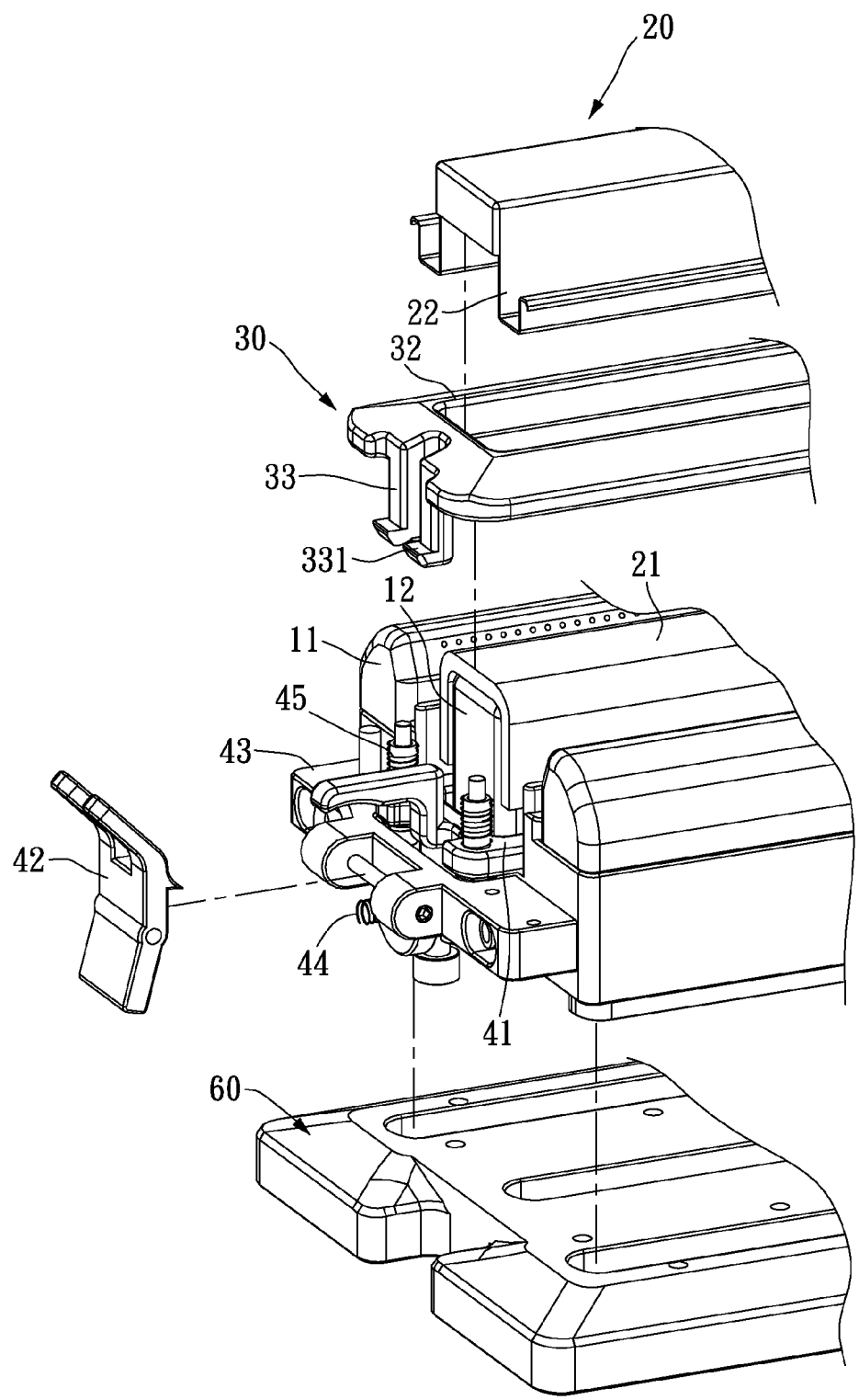
FIG. 2 is a partial exploded view for the photomask cleaning device according to the embodiments of the instant disclosure.
Figure 5:
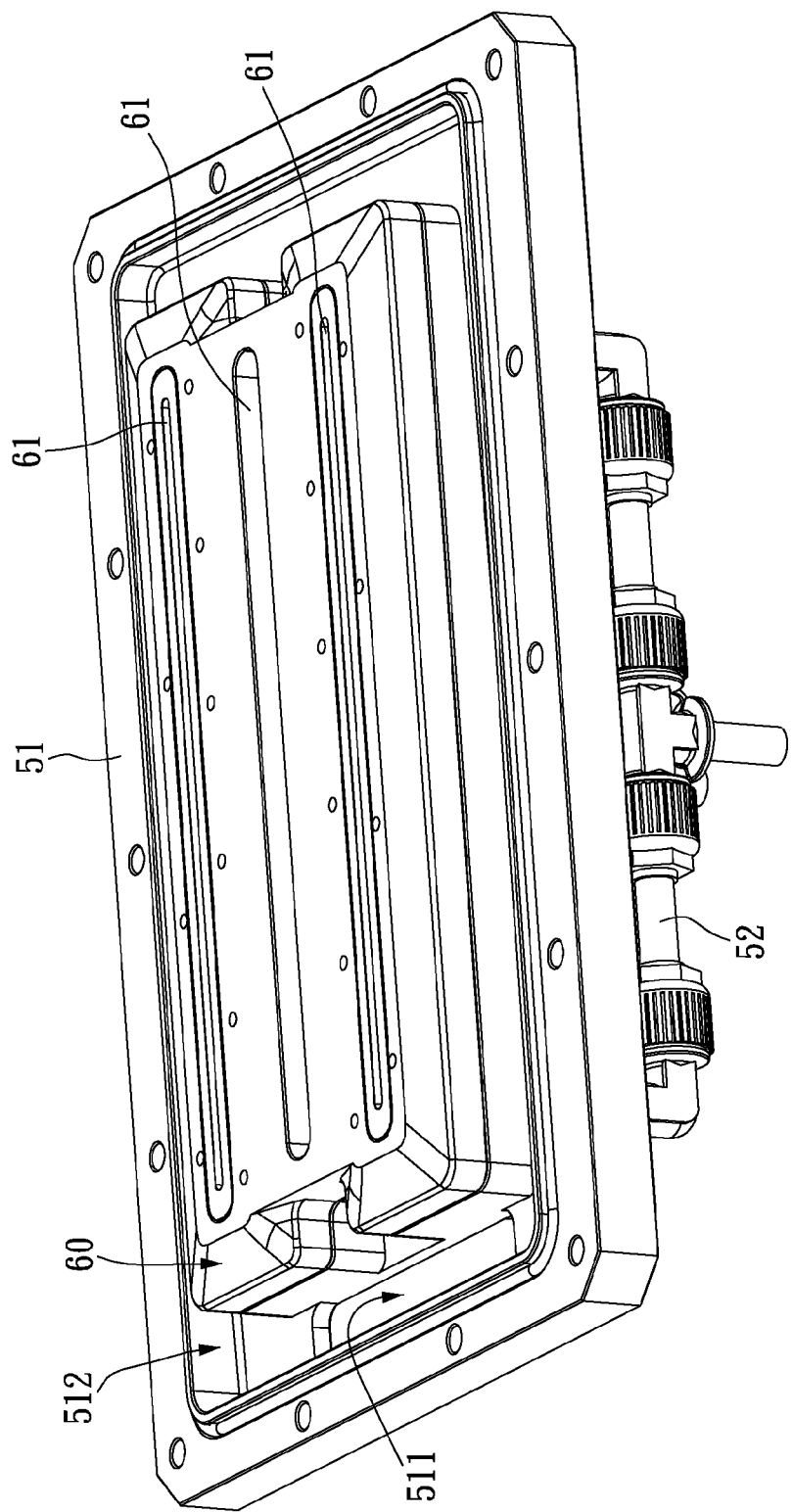
FIG. 5 is a perspective view illustrating the stage and the guiding base for the photomask cleaning device according to the embodiments of the instant disclosure.

Referring to FIG. 2 in conjunction with FIG. 5, the guiding base 60 is disposed on the retaining plate 51, and includes a plurality of guiding channels 61 having a configuration with a predetermined distance therebetween and correspondingly disposed with respect to the fluid supplying conduits 52 for delivering cleaning fluids to the guiding channels 61. The guiding base 60 is integrally formed with an oblique surface 62 slanted towards the retaining plate 51 to allow fluids to flow towards the retaining plate 51 as illustrated in FIGS. 1 and 3. The guiding base 60 is arranged in a configuration so as to provide a predetermined distance between the fluid dispenser 10 and the retaining plate 51 to prevent immersing the dispensing unit 10 into fluids discharged therefrom and particles removed from the photomask 9 to backwash into the fluid dispenser 10.

As shown in FIG. 3, the fluid dispensers 10 includes two oblique dispensing units 11 arranged on two sides of the fluid dispenser 10, a direct dispensing unit 12 arranged between the two oblique dispensing units 11, and two ridges 13. The oblique dispensing units 11 and direct dispensing unit 12 are correspondingly arranged with respect to the guiding channels 61 for communicating fluids therebetween. The two ridges 13 are separately arranged between the oblique dispensing units 11 and the direct dispensing unit 12, in other words, the ridges 13 are generally arranged on two sides of the direct dispensing unit 12. The quantity and configuration of the oblique dispensing units 11, and direct dispensing unit 12 are not limited to the examples of the instant embodiment provided therein. The scrubbing unit 20 includes a resilient member 22 having soft and compressible properties and a scrubbing sheet 21 having non-abrasive properties disposed between the resilient member 22 and the direct dispensing unit 12 for removing and cleaning the photomask 9 without damaging the photomask 9.

The direct dispensing unit 12 can be selected from a fluid dispensing nozzle or a plurality of dispensing openings but is not limited thereto. The direct dispensing unit 12 directly dispenses fluids from a top surface thereof in the general direction of the photomask 9. The top surface of the direct dispensing unit 12 is capped by the scrubbing unit 20 to allow fluids dispensed from the direct dispensing unit 12 to completely saturate the scrubbing unit 20 in the duration of the cleaning process, as saturated scrubbing unit 20 is less prone to leave scratches on photomasks compared to unsaturated scrubbing unit 20. The direct dispensing unit 12 is disposed closer to the photomask 9 compared to the oblique dispensing units 11 so as to prevent the oblique dispensing units 11 to make contact with and form scratches on the photomask 9 during cleaning.

The oblique dispensing units 11 dispense fluids in an oblique direction towards the photomask 9 so as to dispense fluids into a contact region between the scrubbing unit 20 and the photomask 9. When fluid flow is obliquely dispensed onto the photomask 9, fluids can permeate between particles and the photomask 9, thereby separating particles from the photomask 9 and facilitating particle removal along with fluid flow. With the configuration of the scrubbing unit 20 and oblique dispensing units 11, particles are loosened by the scrubbing unit 20 and removed by the obliquely dispensed fluid flow. The oblique dispensing units 11 can be selected from a fluid dispensing nozzle or a plurality of dispensing openings but not limited thereto.

Figure 4:
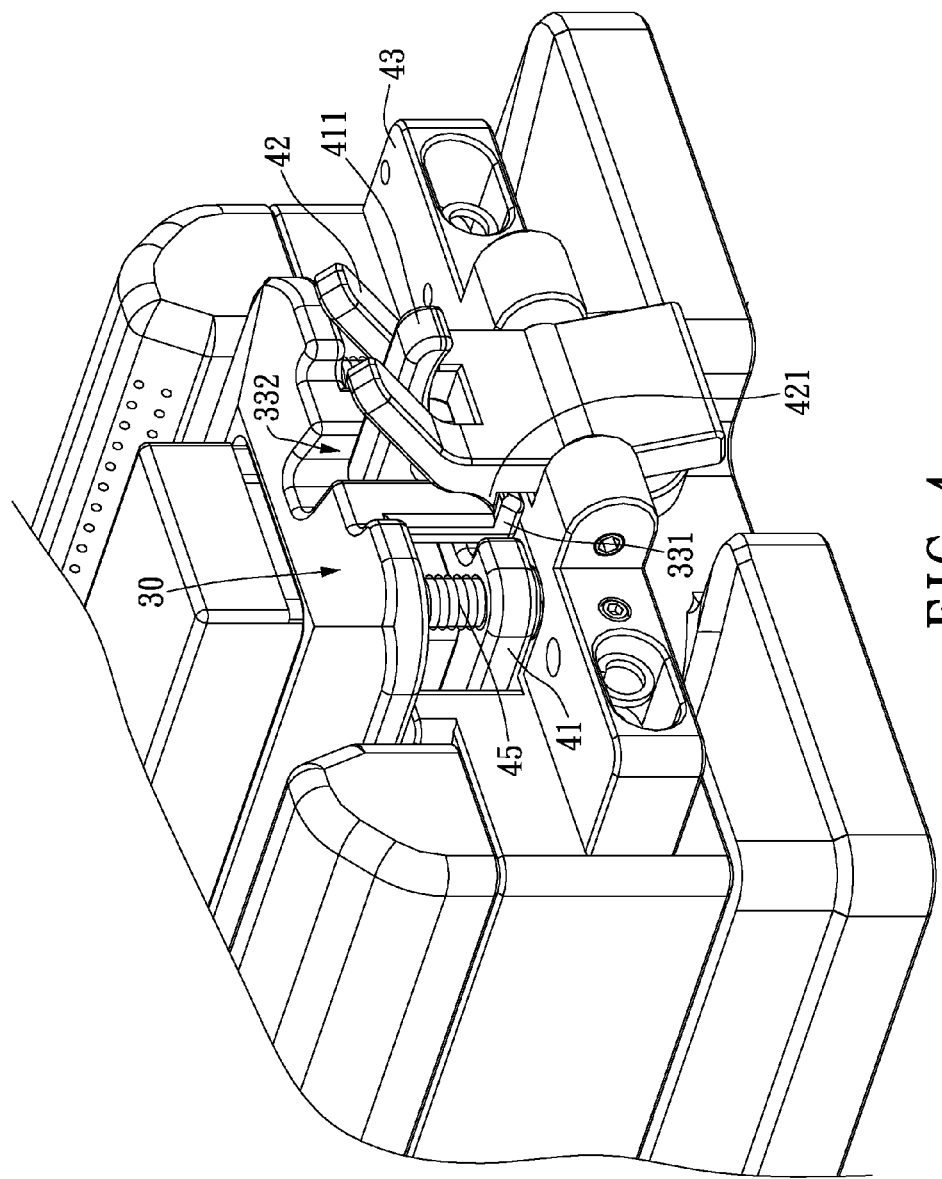
FIG. 4 is a partial perspective view for the photomask cleaning device according to the embodiments of the instant disclosure.

As illustrated in FIGS. 3 and 4, the cover 30 is disposed on the direct dispensing unit 12 configured to allow exposure of the direct dispensing unit 12. A portion of the scrubbing unit 20 is disposed between the fluid dispenser 10 and the cover 30 and caps the direct dispensing unit 12. The cover 30 includes an oblique surface 31 formed thereon which slants towards the retaining plate 51 for fluids to flow therein. The cover 30 is disposed proximate to the oblique dispensing units 11 with a predetermined distance therebetween to facilitate draining. The cover 30 further includes a fixing arm 33 extending along two ends thereof. The fixing arm 33 includes a lip 331 and a slot 332 formed thereon.

Referring to FIG. 4, the cover 30 further includes two grooves 31 correspondingly conforming to the two ridges 13 for secure the scrubbing sheet 22 therebetween and on the direct dispensing unit 12. When the scrubbing sheet 22 is due for replacement, the cover 30 can be lifted for immediate replacement.

Referring to FIG. 2 and FIG. 4, the fixing unit 40 includes a base 43, a clipping member 42, a frame 41, a first elastic member 44 and a second elastic member 45. The frame 41 is disposed around the direct dispensing unit 12 between the cover 30 and the fluid dispenser 10, and includes a handle 411 formed on two ends thereof which glides through the slot 332. The second elastic member 45 is disposed between the frame 41 and the cover 30 while being in a compression state.

The base 43 is disposed on two ends of the fluid dispenser 10, and the clipping member 42 is pivotally coupled to the base 43. The first elastic member 44 is disposed between the base 43 and the clipping member 42. The first elastic member 44 abuts the base 43 at one end while abutting the clipping member 42 at the other end thereof. Since the second elastic member 45 is compressed between the cover 30 and the frame 41, the second elastic member 45 provides an upward force against the cover 30. Moreover, the clipping member 42 includes a shoulder 421 which abuts the lip 331 of the fixing arm 33. Due to the compression state of the first elastic member 44, a reaction and opposing force therefrom is applied onto the clipping member 42, thus rendering the shoulder 421 to maintain the abutment between the shoulder 421 and the lip 331, and thereby securing the cover 30 to the frame 41 of the fixing unit 40 while allowing the cover 30 to be released for facilitating the replacement of the scrubbing unit 20.

In summary, with the configuration of the oblique dispensing unit 11 and the scrubbing unit 20, particles on photomasks are obliquely rinsed and removed through fluid flow, thus providing relatively cleaned photomasks. Moreover, with the oblique surfaces 32, 62 of the cover 30 and guiding base 60, fluids and effluents can be smoothly drained. In addition, the replacement of the scrubbing unit 20 is facilitated through the configuration of the fixing unit 40 and cover 30.

The figures and descriptions supra set forth illustrated the preferred embodiments of the instant disclosure; however, the characteristics of the instant disclosure are by no means restricted thereto. All changes, alternations, combinations or modifications conveniently considered by those skilled in the art are deemed to be encompassed within the scope of the instant disclosure delineated by the following claims.

What is claimed is:

1. A photomask cleaning device for cleaning photomasks, comprising:
    a fluid dispenser including a centrally arranged direct dispensing unit and at least one oblique dispensing unit flanking the direct dispensing unit for dispensing fluids towards a photomask;
    a scrubbing unit disposed above the direct dispensing unit for cleaning the photomask;
    a cover disposed on the direct dispensing unit for securing the scrubbing unit to the direct dispensing unit;
    a fixing unit securing the cover to the fluid dispenser; and
    a stage including a retaining plate disposed beneath the fluid dispenser, and at least one fluid supplying conduit supplying fluids to the at least one oblique dispensing unit and the direct dispensing unit and having one end attached to the retaining plate, wherein the device supports the photomask during cleaning such that an underside thereof is cleaned.

2. The device as recited in claim 1, wherein the fluid dispenser includes two oblique dispensing units disposed on opposing sides of the direct dispensing unit.

3. The device as recited in claim 1, wherein the direct dispensing unit is disposed closer to the photomask compared to the at least one oblique dispensing unit.

4. The device as recited in claim 1, wherein the fluid dispenser further includes a ridge arranged on two sides thereof and correspondingly conforming to a groove arranged on the cover.

5. The device as recited in claim 4, wherein the scrubbing unit is secured between the ridge and the groove through a bent portion of the scrubbing unit.

6. The device as recited in claim 1, wherein the cover includes an oblique surface slanted towards the retaining plate.

7. The device as recited in claim 1 further comprising:
a guiding base arranged between the fluid dispenser and the retaining plate, and including a plurality of guiding channels correspondingly disposed with the at least one oblique dispensing unit and the direct dispensing unit.

8. The device as recited in claim 7, wherein the guiding base includes an oblique surface slanted towards the retaining plate.

9. The device as recited in claim 1, wherein the cover includes at least one fixing arm extending from two sides thereof and slanted towards the retaining plate.

10. The device as recited in claim 9, wherein the fixing unit includes a frame disposed around two sides of the direct dispensing unit between the cover and the fluid dispenser, a base disposed on two sides of the fluid dispenser, and a clipping member pivotally coupled to the base.

11. The device as recited in claim 10, wherein the fixing unit further includes a first elastic member disposed between the base and the clipping member having a shoulder arranged on one end thereof parallel to the retaining plate to abut a lip of the fixing arm.

12. The device as recited in claim 11, wherein the fixing unit further includes at least one second elastic member disposed between the cover and the frame.

13. The device as recited in claim 10, wherein the frame is formed with a handle on two ends thereof which glides through a slot formed on the fixing arm.

14. The device as recited in claim 1, wherein the retaining plate includes a pit formed on one end of the retaining plate and a slit.

15. The device as recited in claim 1, wherein the scrubbing unit includes a scrubbing sheet and a resilient member disposed between the scrubbing sheet and the direct dispensing unit.

* * * * *